United States Patent
Ha et al.

(10) Patent No.: US 10,104,767 B2
(45) Date of Patent: Oct. 16, 2018

(54) PRINTED CIRCUIT BOARD

(71) Applicant: Samsung Electro-Mechanic Co., Ltd., Suwon-si (KR)

(72) Inventors: Hyung-Gi Ha, Daejeon (KR); Jong-Myeon Lee, Yongin-si (KR); Jong-Rip Kim, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 80 days.

(21) Appl. No.: 15/082,020

(22) Filed: Mar. 28, 2016

(65) Prior Publication Data

US 2017/0079143 A1    Mar. 16, 2017

(30) Foreign Application Priority Data

Sep. 16, 2015   (KR) .................. 10-2015-0131016

(51) Int. Cl.
   *H05K 1/18*    (2006.01)
   *H05K 1/02*    (2006.01)
   *H05K 3/00*    (2006.01)

(52) U.S. Cl.
   CPC ......... *H05K 1/0271* (2013.01); *H05K 3/0097* (2013.01); *H05K 1/185* (2013.01); *H05K 3/0052* (2013.01); *H05K 2201/09136* (2013.01); *H05K 2201/09781* (2013.01); *H05K 2201/10* (2013.01)

(58) Field of Classification Search
   CPC ........................ H05K 1/185; H05K 2201/10
   USPC ................................... 361/761–764
   See application file for complete search history.

(56) References Cited

U.S. PATENT DOCUMENTS

| | | | |
|---|---|---|---|
| 6,580,620 B1* | 6/2003 | Kim ............... | H01L 21/565 257/787 |
| 2007/0290361 A1* | 12/2007 | Chen .............. | H01L 23/5226 257/773 |
| 2010/0300602 A1* | 12/2010 | Ichiyanagi ....... | H01G 4/232 156/89.12 |
| 2016/0021753 A1* | 1/2016 | Tomikawa ........ | H05K 1/185 361/761 |

FOREIGN PATENT DOCUMENTS

KR   10-2009-0079448 A   7/2009

* cited by examiner

*Primary Examiner* — Binh Tran
(74) *Attorney, Agent, or Firm* — NSIP Law

(57) ABSTRACT

A printed circuit board includes: a strip substrate sectioned into unit areas; electronic components respectively installed in each of the unit areas; and a separation space disposed between the unit areas.

16 Claims, 4 Drawing Sheets

PRINTED CIRCUIT BOARD

CROSS-REFERENCE TO RELATED APPLICATION(S)

This application claims the benefit under 35 USC 119(a) of Korean Patent Application No. 10-2015-0131016, filed on Sep. 16, 2015 in the Korean Intellectual Property Office, the entire disclosure of which is incorporated herein by reference for all purposes.

BACKGROUND

1. Field

The following description relates to a printed circuit board.

2. Description of Related Art

With the recent advancements in smartphones, tablet PCs and wearable devices, printed circuit boards have been required to be smaller and thinner. Accordingly, printed circuit boards having a thin semiconductor integrated circuit (IC) embedded therein have been developed. However, as an area of the IC relative to the size of the printed circuit board becomes excessively large, a warpage problem occurs, making it difficult to handle the printed circuit board.

An example of a printed circuit board including an embedded IC is described in Korean Patent Publication No. 10-2009-0079448 (METHOD FOR MANUFACTURING PRINTED CIRCUIT BOARD HAVING EMBEDDED CHIP AND PRINTED CIRCUIT BOARD HAVING AN EMBEDDED CHIP USING THE SAME; laid open on Jul. 22, 2009).

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

According to one general aspect, a printed circuit board includes: a strip substrate sectioned into unit areas; electronic components respectively installed in each of the unit areas; and a separation space disposed between the unit areas.

A ratio of a cross-sectional area of a portion occupied by the electronic components to a cross-sectional area of portions occupied by the unit areas and the separation space may be greater than or equal to 0.2 and less than or equal to 0.5.

The printed circuit board may further include a dummy pattern disposed in the separation space.

The dummy pattern may include a metallic material.

A length of the dummy pattern in one direction may be equal to a length of one of the unit areas in the one direction.

The strip substrate may include: a core having the electronic component installed therein; and an inner layer circuit disposed on the core.

The dummy pattern may be disposed on the core.

The dummy pattern may be made of a material that is the same as a material of the inner layer circuit.

The strip substrate may further include an insulating layer laminated on the core and covering the inner layer circuit and the dummy pattern.

The dummy pattern may include a plurality of dummy patterns, and the plurality of dummy patterns may be disposed at regular intervals.

The dummy area may be disposed at a boundary of the strip substrate, and a dummy pattern may be formed in the dummy area.

The cavities may be respectively formed in each of the unit areas, and the electronic components may be inserted in the cavities.

A cross-sectional area of the cavities may be greater than a cross-sectional area of the electronic components, and an insulating layer may be filled between the cavities and the electronic components.

The printed circuit board may further include dicing lines disposed on an outside of the unit areas.

The printed circuit board may further include a dummy pattern disposed in the separation space and not contacting the dicing lines.

The dummy pattern may be configured to structurally reinforce the strip substrate.

The electronic components may be disposed in cavities completely penetrating a core of the strip substrate.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
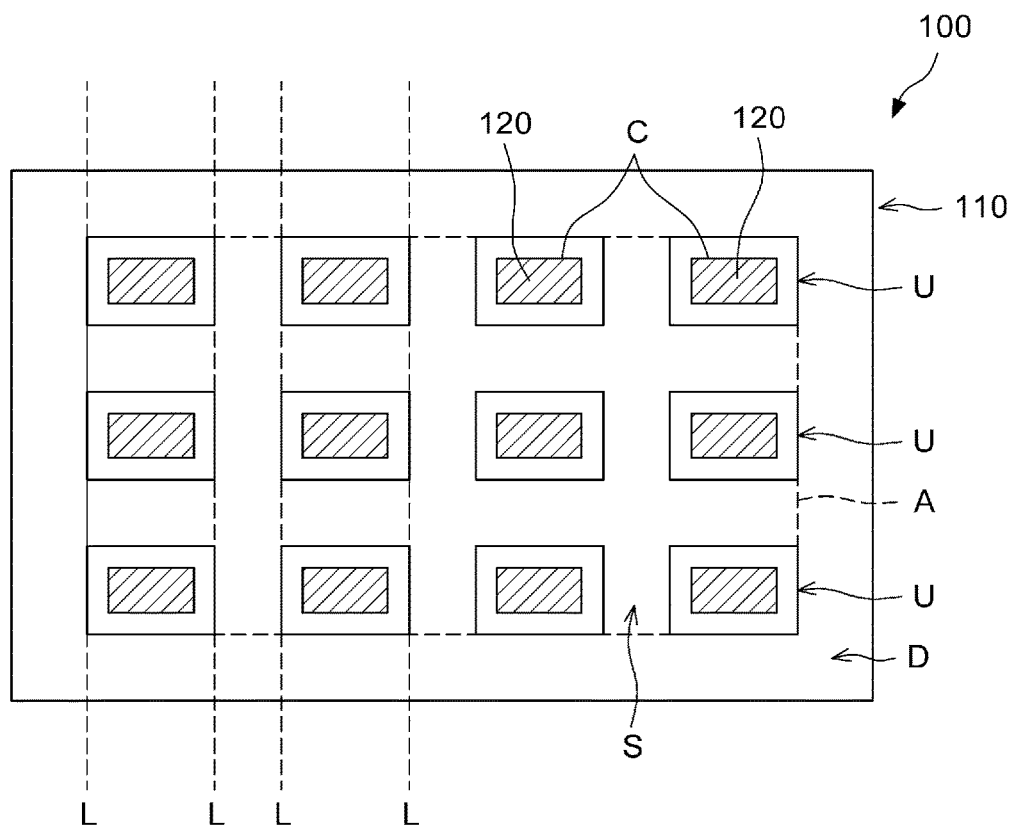
FIG. 1 and FIG. 2 illustrate an example of a printed circuit board.

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Unless otherwise defined, all terms, including technical terms and scientific terms, used herein have the same meaning as how they are generally understood by those of ordinary skill in the art to which the present disclosure pertains. Any term that is defined in a general dictionary shall be construed to have the same meaning in the context of the relevant art, and, unless otherwise defined explicitly, shall not be interpreted to have an idealistic or excessively formalistic meaning.

Identical or corresponding elements will be given the same reference numerals, regardless of the figure number, and any redundant description of the identical or corresponding elements will not be repeated. Throughout the description of the present disclosure, when describing a certain relevant conventional technology is determined to evade the point of the present disclosure, the pertinent detailed description will be omitted. Terms such as "first" and "second" can be used in describing various elements, but the above elements shall not be restricted to the above terms. The above terms are used only to distinguish one element from the other. In the accompanying drawings, some elements may be exaggerated, omitted or briefly illustrated, and the dimensions of the elements do not necessarily reflect the actual dimensions of these elements.

Figure 2:
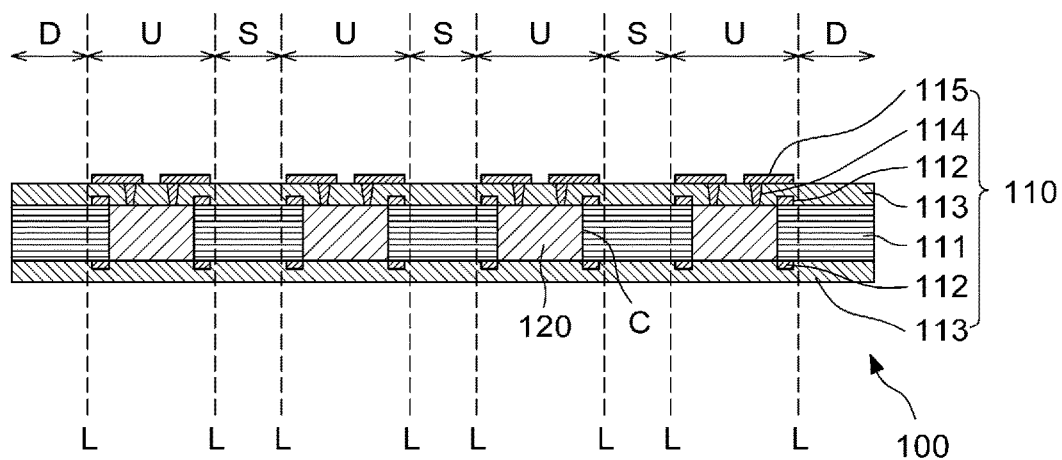

FIG. 1 and FIG. 2 illustrate an example of a printed circuit board 100.

Referring to FIG. 1 and FIG. 2, the printed circuit board 100 includes a strip substrate 110 sectioned into unit areas U which are separated from one other by a separation space S provided between the unit areas U. The printed circuit board 100 includes electronic components 120 installed, respectively, in the unit areas U.

The strip substrate 110 is eventually severed into individual unit areas U in the course of manufacturing the printed circuit board 100. The disclosure herein describes the strip substrate 110 before being divided into the individual unit areas U.

The strip substrate 110 includes the unit areas U and a dummy area D. The unit areas U and the dummy area D shall be understood to be defined areas that are not physically separate from each other or the separation space S.

The unit area U refers to an area functioning as a substrate when the strip substrate 110 is eventually severed, and the dummy area D refers to an area formed at a boundary of the strip substrate 110 to allow equipment required for handling the strip substrate 110 to be coupled thereto.

The unit area U has dicing lines L on an outside thereof. The strip substrate 110 may be severed along the dicing lines L and separated into individual unit areas U.

The dummy area D may have a mold gate (not shown), which is used for molding, a tooling hole (not shown), which is used as a reference while machining the strip substrate 110, and an alignment mark (not shown).

Referring to FIG. 1, the electronic component 120 is installed in each of the unit areas U. Each of the unit areas U has a cavity C formed therein, and the electronic component 120 are installed in the respective cavities C. A cross-sectional area of the cavity C may be greater than or equal to a cross-sectional area of the electronic component 120.

Although it is illustrated that the cross-sectional area of the cavity C is identical with that of the electronic component 120, the cavity C may be formed to have a greater cross-sectional area than that of the electronic component 120 due to a machining tolerance if the cavity C is formed using, for example, laser. As will be described in more detail later, in the case where the cross-sectional area of the cavity C is greater than that of the electronic component 120, an insulating layer 113 is filled in between the cavity C and the electronic component 120.

The unit areas U may be each formed in a rectangular shape, for example, a square. The cross-sectional dimensions of each unit area U may be, for example, 4 mm by 4 mm. The cross-sectional dimensions of the electronic component 120 being installed in the unit area U may be, for example, 3 mm by 3 mm. However, other dimensions are possible for the unit areas U and the electronic components 120.

In this example, if there were no separation space S between the unit areas U, the areas occupied by the electronic components 120 would be more than 50% of the areas occupied by the unit areas U in the strip substrate 110. Particularly, in the case where the electronic components 120 are each installed in the cavity C, the strip substrate 110 is removed by more than the overall volume of the electronic components 120, thereby weakening the rigidity of the strip substrate 110. As a result, the strip substrate 110 may be greatly warped.

However, by providing the separation space S between the unit areas U, as described herein, the ratio of the areas occupied by the electronic components 120 in the strip substrate 110 is reduced. As a result, warpage of the strip substrate 110 may be mitigated.

The warpage may be sufficiently mitigated when the ratio of the cross-sectional areas of portions occupied by the electronic components 120 to a cross-sectional area A of portions occupied by the unit areas U and the separation space S is 0.5 or less.

If the separation space S between the unit areas U were too large, the number of unit areas U would be reduced in the strip substrate 110. Accordingly, the ratio of the cross-sectional areas of portions occupied by the electronic components 120 to the cross-sectional area A of portions occupied by the unit areas U and the separation space S may preferably be 0.2 or greater.

For example, referring to one of the unit areas U, in the case where a gap between unit areas U (i.e., a width of the separation space S) is 1 mm, the cross-sectional area of a portion occupied by the unit area U and the separation space S is 25 mm$^2$, and the cross-sectional area of a portion occupied by the electronic component 120 is 9 mm$^2$, and thus the ratio of the cross-sectional areas is 0.36.

The calculated ratios of the cross-sectional areas when the gaps between unit areas U (i.e., widths of the separation space S) are 2 mm, 3 mm and 4 mm, respectively, are shown in Table 1 below.

TABLE 1

| Chip size (mm) | | Unit size (mm) | | Gap between units (mm) | | Ratio of areas (%) |
| --- | --- | --- | --- | --- | --- | --- |
| Width | Height | Width | Height | Width | Height | |
| 3 | 3 | 4 | 4 | — | — | 56% |
| | | | | 1 | 1 | 36% |
| | | | | 2 | 2 | 25% |
| | | | | 3 | 3 | 18% |

Referring to Table 1, it is preferable when the gaps between the unit areas are 1 mm and 2 mm, but a severe warpage occurs when there is no gap between the unit areas U, and it is inefficient when the gap between the unit areas U is 3 mm or greater because there are too few unit areas U for each strip substrate 110.

As a result, the ratio of the cross-sectional area of the portion occupied by the electronic components 120 to the cross-sectional area A of the portions occupied by the unit areas U and the separation space S may be greater than or equal to 0.2 and less than or equal to 0.5.

As described above, the size of the separation space S is determined by considering the size of the electronic component 120 and the size of the unit areas U. Accordingly, a warpage problem of a printed circuit board may be efficiently solved.

Referring to FIG. 2, the strip substrate 110 includes a core 111 having the electronic components 120 installed therein and inner layer circuits 112 formed on the core 111. More specifically, the inner layer circuits 112 include an upper inner layer circuit 112 disposed on a top surface of the core 111 and a lower inner layer circuit 112 disposed on a bottom surface of the core 111. The core 111 is made of an insulating material. The core 111 may include a resin material, for example, a prepreg, which has a stiffener, such as glass fiber or inorganic filler, contained therein.

The core 111 has the cavities C formed therein, and the electronic components 120 disposed in the cavities C. The cavities C penetrate the core 111 either completely or partially. A copper clad laminate (CCL), for example, may be a raw material for the core 111. The cavities C are formed in the insulating material of the CCL, and a copper foil of the CCL becomes the inner layer circuits 112.

The strip substrate 110 further includes insulating layers 113 laminated on the core 111. More specifically, the insulating layers 113 include an upper inner insulating layer 113 disposed on the top surface of the core 111 over the upper inner layer circuit 112 and electronic components 120, and a lower insulating layer 113 disposed on the bottom surface of the core 111 below the lower inner layer circuit 112 and the electronic components 120. The insulating layers 113 may be made, for example, of a thermosetting resin such as an epoxy resin, a thermoplastic resin such as polyimide, or resin such as a prepreg having a stiffener impregnated therein.

In the case in which a cavity C penetrates the core 111 completely, as shown in FIG. 2, the electronic component 120 may be installed within the cavity C by attaching a tape on a bottom surface of the core 111 and attaching the electronic component 120 on the tape in the cavity C. Then, the tape is removed after laminating the upper insulating layer 113 on a top surface of the core 111 having the electronic component 120 inserted therein, and the lower insulating layer 113 is laminated on the bottom surface of the core 111, completing the installation of the electronic component 120 within the cavity C.

In this example, the resin of the insulating layers 113, for example, epoxy resin, may flow into the cavities C, and thus the resin of the insulating layers 113 may be filled in gaps between the cavities C and the respective electronic components 120.

The upper insulating layer 113 has vias 114 formed therein for electrical connection with the inner layer circuits 112 and the electronic component 120. The vias 114 may be formed by machining via holes using, for example, laser within the upper insulating layer 113 and then filling a conductive material in the via holes.

Moreover, an outer layer circuit 115 is formed on the top surface of the upper insulating layer 113 and connected to the inner layer circuits 112 by way of the vias 114. The inner layer circuits 112 and the outer layer circuit 115 may be made of any conductive material, for example, copper.

Figure 3:
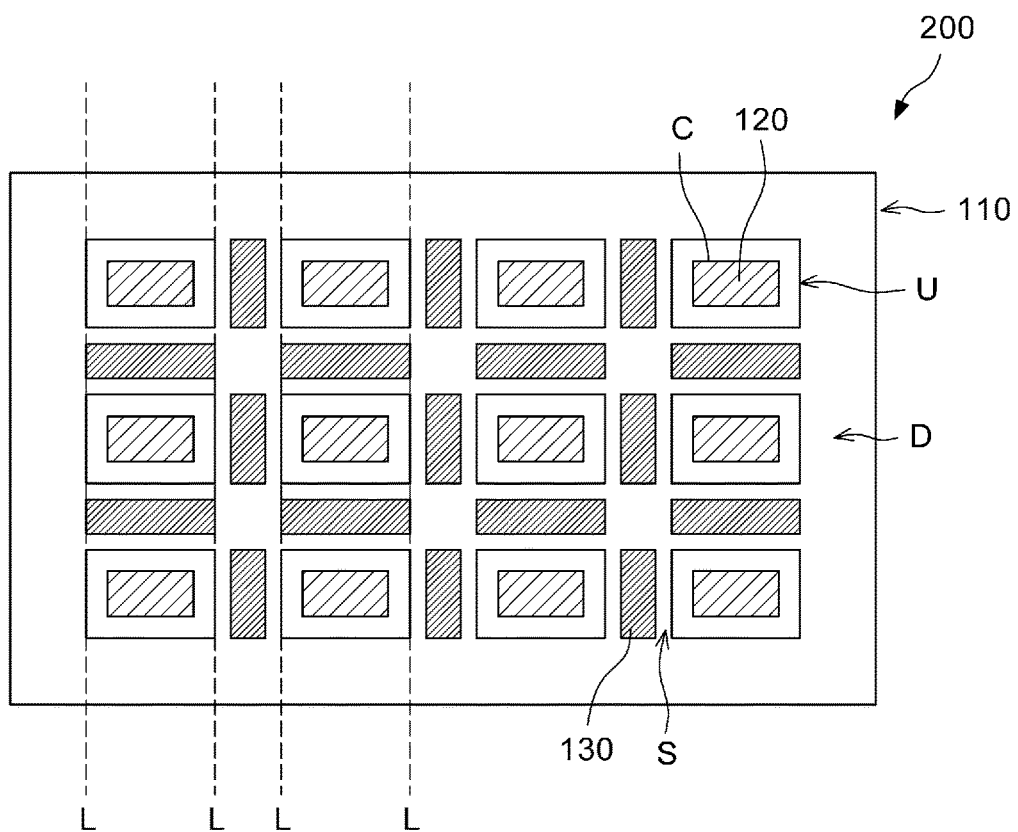
FIG. 3 and FIG. 4 illustrate another example of a printed circuit board.
Figure 4:
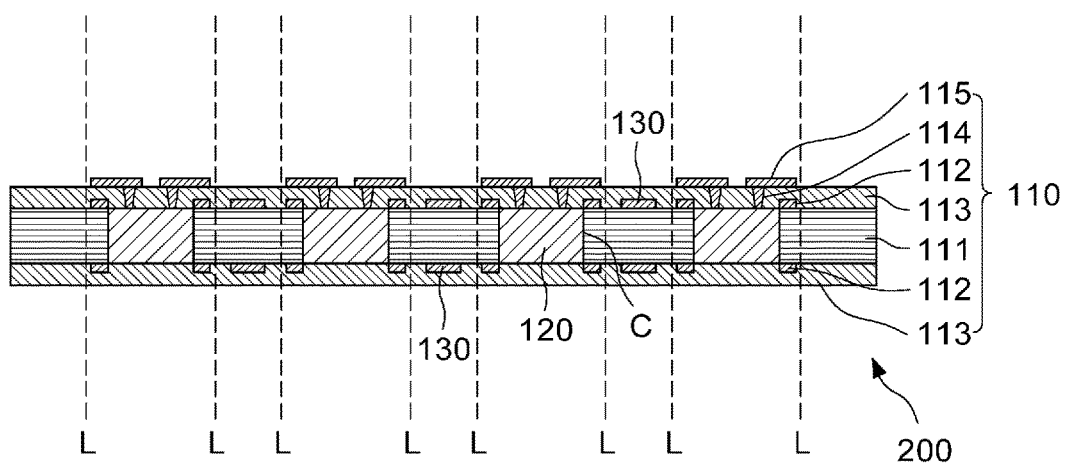

FIGS. 3 and 4 illustrate another example of a printed circuit board 200.

Referring to FIG. 3, the printed circuit board 200 includes upper and lower dummy patterns 130 in a separation space S. The dummy patterns 130 provides rigidity to (i.e., structurally reinforces) the strip substrate 110.

The dummy pattern 130 is formed to avoid (i.e., not contact) dicing lines L outside unit areas U. The dummy pattern 130 may be made of a metallic material.

Referring to FIG. 4, the upper and lower dummy patterns 130 are formed on the core 111 and may be formed together with the upper and lower inner layer circuits 112, respectively, while the inner layer circuits 112 are formed. Accordingly, the dummy patterns 130 may have a same thickness and a same material as those of the inner layer circuits 112. The dummy patterns 130 may be wider than the inner layer circuits 112.

The upper and lower insulating layers 113 cover the upper and lower inner layer circuits 112, respectively, and the upper and lower dummy patterns 130, respectively. Since the dummy patterns 130 have no actual function of a circuit, the dummy patterns 130 are not electrically connected with the vias 114 and the inner layer circuits 112.

When the insulating layers 113 are laminated in the separation space S interposed between the unit areas U, the dummy patterns 130 function to prevent a void from occurring in the insulating layers 113. In other words, if there were no dummy patterns 130, the insulating layers 113 could be heaved from the separation space S when the insulating layers 113 are laminated on the core 111. However, it is possible to prevent this heaving problem by forming the dummy patterns 130.

As illustrated in FIG. 3, a length of the dummy patterns 130 in one direction may be identical with a length of the unit areas U in the one direction.

Figure 5:
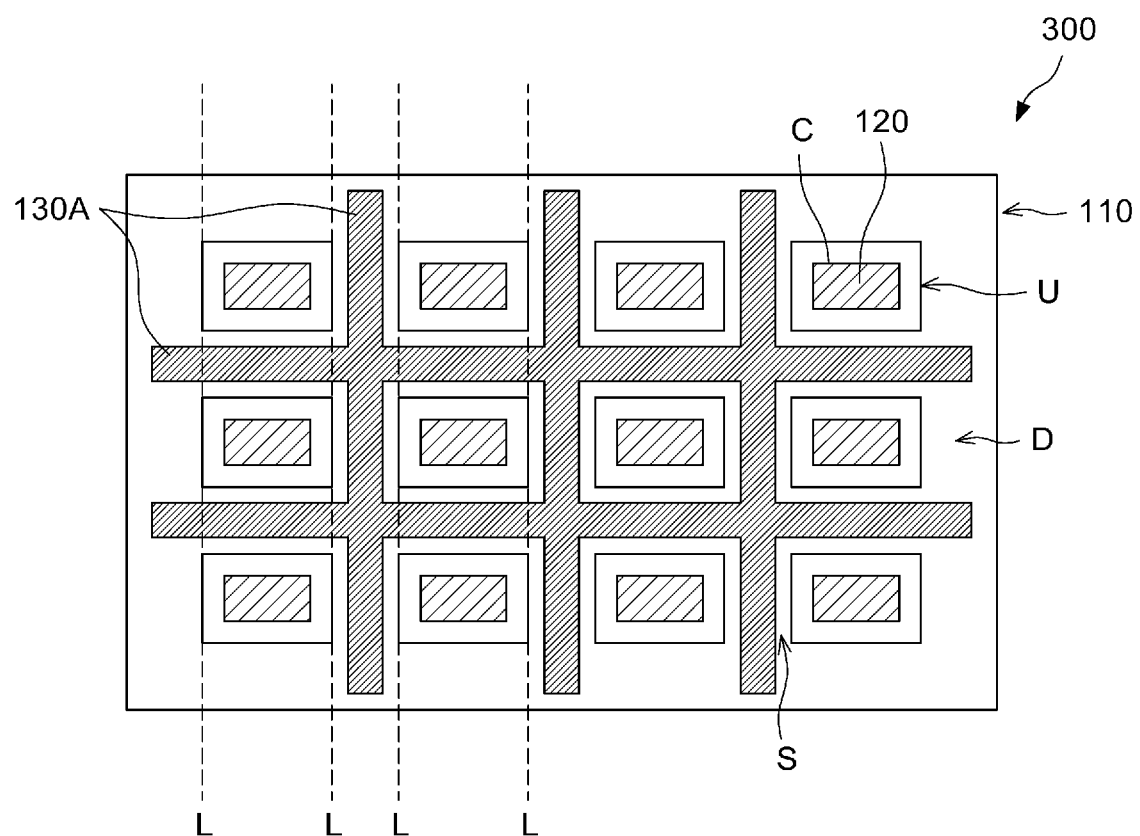
FIG. 5 illustrates another example of a printed circuit board.

FIG. 5 illustrates another example of a printed circuit board 300, which is similar to the printed circuit board 200, except that the printed circuit board 300 includes upper and lower dummy patterns 130A. As illustrated in FIG. 5, the length of the dummy patterns 130A in one direction may be greater than the length of the unit area U in the one direction, and may be similar to a length of the strip substrate 110.

In the embodiments of FIGS. 3-5, the upper and lower dummy patterns 130/130A may each include a plurality of dummy patterns disposed at regular intervals. By disposing the plurality of dummy patterns 130/130A at regular intervals, it is possible to form the printed circuit board 200/300 with no deviation in the thickness thereof.

Figure 6:
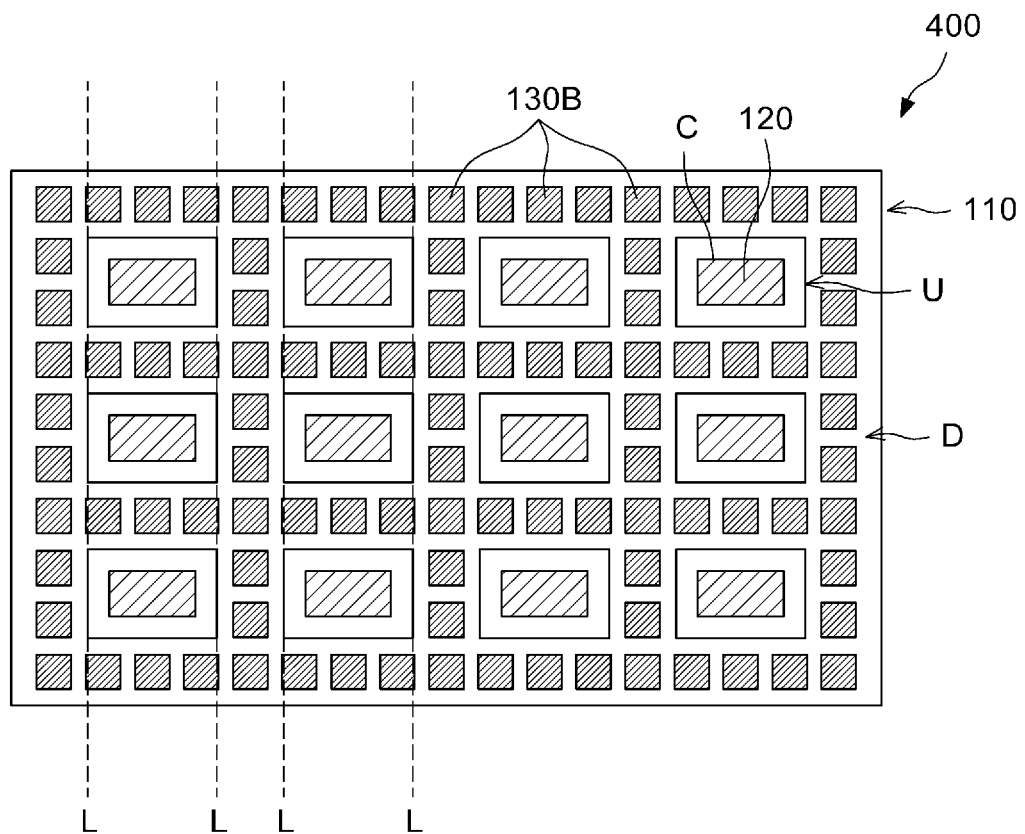
FIG. 6 and FIG. 7 illustrate another example of a printed circuit board.
Figure 7:
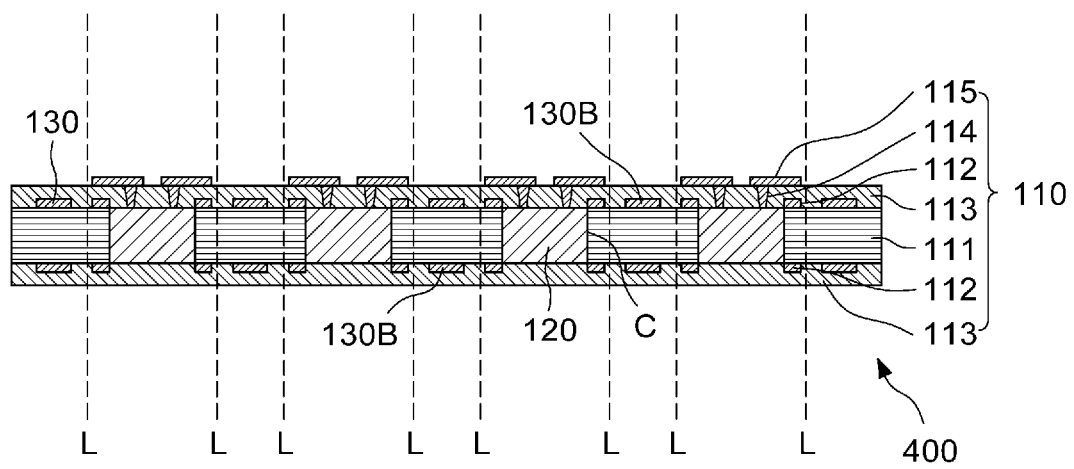

FIG. 6 and FIG. 7 illustrate another example of a printed circuit board 400. The printed circuit board 400 includes upper and lower dummy patterns 130B formed in a separation space S and a dummy area D of a strip substrate 110.

As described above, the dummy area D of the strip substrate 110 is an area formed at a boundary of the strip substrate 110. The features of the dummy patterns 130 and 130A described with reference to the embodiments of FIGS. 3-5 may be equivalently applied to the embodiment of FIGS. 6 and 7.

By forming the dummy patterns 130B throughout the separation space S and the dummy area D, it is possible to enhance the rigidity of the strip substrate 110 and reduce voids that may occur when the insulating layers 113 are laminated.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A printed circuit board comprising:
a strip substrate sectioned into unit areas by dicing lines;
electronic components respectively installed in each of the unit areas; and
a separation space disposed between adjacent dicing lines, among the dicing lines, that are disposed between adjacent unit areas, among the unit areas, such that the separation space is disposed around each of the unit areas,
wherein the separation space is configured to be removed by dicing of the unit areas at the dicing lines, and a ratio of cross-sectional areas of portions occupied by the electronic components to a cross-sectional area of a portion occupied by the unit areas and the separation space is greater than or equal to 0.2 and less than or equal to 0.5.

2. The printed circuit board as set forth in claim 1, further comprising an electrically non-functional dummy pattern disposed in the separation space, and configured to be removed with the separation space by the dicing of the unit areas.

3. The printed circuit board as set forth in claim 2, wherein the electrically non-functional dummy pattern comprises a metallic material.

4. The printed circuit board as set forth in claim 2, wherein a length of the electrically non-functional dummy pattern in one direction is equal to a length of one of the unit areas in the one direction.

5. The printed circuit board as set forth in claim 2, wherein the strip substrate comprises:
a core having the electronic components installed therein; and
an inner layer circuit disposed on the core.

6. The printed circuit board as set forth in claim 5, wherein the electrically non-functional dummy pattern is disposed on the core.

7. The printed circuit board as set forth in claim 5, wherein the electrically non-functional dummy pattern is made of a material that is the same as a material of the inner layer circuit.

8. The printed circuit board as set forth in claim 5, wherein the strip substrate further comprises an insulating layer laminated on the core and covering the inner layer circuit and the electrically non-functional dummy pattern.

9. The printed circuit board as set forth in claim 2, wherein the electrically non-functional dummy pattern comprises a plurality of dummy patterns disposed at regular intervals.

10. The printed circuit board as set forth in claim 1, wherein a dummy area is disposed at a boundary of the strip substrate, and wherein a dummy pattern is formed in the dummy area.

11. The printed circuit board as set forth in claim 1, wherein cavities are respectively formed in each of the unit areas, and wherein the electronic components are inserted in the cavities.

12. The printed circuit board as set forth in claim 11, wherein a cross-sectional area of the cavities is greater than a cross-sectional area of the electronic components, and wherein an insulating layer is filled in between the cavities and the electronic components.

13. The printed circuit board of claim 1, further comprising a dummy pattern disposed in the separation space and not contacting the dicing lines.

14. The printed circuit board of claim 13, wherein the dummy pattern is configured to structurally reinforce the strip substrate.

15. The printed circuit board of claim 1, wherein the electronic components are disposed in cavities completely penetrating a core of the strip substrate.

16. A printed circuit board comprising:
a strip substrate sectioned into unit areas by dicing lines, and comprising a core;
electronic components disposed in the core, and respectively disposed in each of the unit areas; and
an inner layer circuit disposed on the core;
a separation space disposed between two adjacent dicing lines, among the dicing lines, that are disposed between adjacent unit areas, among the unit areas; and
an electrically non-functional dummy pattern disposed on the core, in the separation space, and having a width greater than a width of the inner layer circuit,
wherein the separation space and the dummy pattern are configured to be removed by dicing of the adjacent unit areas at the two adjacent dicing lines.

* * * * *